US006683972B1

(12) United States Patent
Mathiak

(10) Patent No.: US 6,683,972 B1
(45) Date of Patent: Jan. 27, 2004

(54) IMAGE PROCESS, COMPUTER TO EVALUATE DATA AND NUCLEAR RESONANCE TOMOGRAPH EQUIPPED WITH SUCH A COMPUTER

(75) Inventor: Klaus Mathiak, Tübingen (DE)

(73) Assignee: Forschungszentrum Jülich GmbH (DE)

(*) Notice: Subject to any disclaimer, the term of this patent is extended or adjusted under 35 U.S.C. 154(b) by 0 days.

(21) Appl. No.: 09/577,293

(22) Filed: May 23, 2000

(51) Int. Cl.[7] .................................................. G06K 9/00
(52) U.S. Cl. ........................................ 382/131; 382/128
(58) Field of Search .............................. 382/128, 131, 382/107, 275

(56) References Cited

U.S. PATENT DOCUMENTS 5,479,537 A * 12/1995 Hamashima et al. ........ 382/266

OTHER PUBLICATIONS

Huang, *Image Sequence Analysis*, Springer–Verlag, New York, pp. 294–295 (1981).
Jähne, *Digital Image Processing*, Springer–Verlag, New York, pp. 276–285 (1991).

Cox et al., "Real–Time Functional Magnetic Resonance Imaging", *Magn. Reson. Med.*, 33, pp. 230–236 (1995).
Zoroofi et al., "MRI Artifact Cancellation Due to Rigid Motion in the Imaging Plane", *IEEE Transactions on Medical Imaging*, vol. 15, No. 6, pp. 768–784 (Dec. 1996).
Weerasinghe et al., "An Improved Algorithm for Rotational Motion Artifact Suppression in MRI", *IEEE Transactions on Medical Imaging*, vol. 17, No. 2, pp. 310–317 (Apr. 1998).
K.J. Friston et al., "Movement–Related Effects in fMRI Time–Series",*Magn Reson Med* 1996 Mar.; 35(3):346–55.

* cited by examiner

Primary Examiner—Leo Boudreau
Assistant Examiner—Tom Y. Lu
(74) Attorney, Agent, or Firm—Connolly Bove Lodge & Hutz LLP

(57) ABSTRACT

An imaging process in which measured data is employed to generate at least one image, the image is then compared to a reference image, on the basis of this comparison a relative position between the image and the reference image is determined, and any influence of the relative position of the images is eliminated. The imaging process comprises determining a gradient of image data in the reference image in a first coordinate system, determining a movement-corrected vector, and transforming the image data from a first coordinate system into a second coordinate system.

11 Claims, 5 Drawing Sheets

IMAGE PROCESS, COMPUTER TO EVALUATE DATA AND NUCLEAR RESONANCE TOMOGRAPH EQUIPPED WITH SUCH A COMPUTER

FIELD OF THE INVENTION

The invention relates to an imaging process in which measured data is employed to generate at least one image, whereby the image is then compared to a reference image and, on the basis of this comparison, a relative position between the image and the reference image is ascertained and whereby any influence of the relative position is subsequently eliminated.

The invention also relates to a computer that serves to evaluate measured data as well as to a nuclear resonance tomograph equipped with such a computer.

BACKGROUND OF THE INVENTION

Imaging processes and measuring or evaluation units that are able to graphically depict collected information are important in a wide array of technical fields. Particularly in medicine, many areas of application are known for imaging processes.

In such imaging processes, raw data that has been obtained is normally converted into the desired image information by means of a suitable transformation, especially a two-dimensional or three-dimensional Fourier transform.

A reconstructed tomograph consists of pixels (=picture element), and a volume data set consists of voxels (=volume element). A pixel is a two-dimensional picture element, for instance, a square. The image is made up of pixels. A voxel is a three-dimensional volume element, for example, a cube which, for measurement methodological reasons, does not exhibit any sharp boundaries. The dimensions of a pixel normally lie in the order of magnitude of 1 mm$^2$, and those of a voxel in the order of magnitude of 1 mm$^3$. The geometries and dimensions can vary.

Seeing that, for experimental reasons, it is never possible to assume a strictly two-dimensional plane in the case of tomographs, the term voxel is often employed here as well, since it takes into consideration the fact that the image planes have a certain penetration depth into the third dimension.

Imaging processes are employed, for example, to graphically depict ultrasound examinations or in nuclear resonance tomography. Since such examinations normally take place in vivo, movements on the part of the test subject are superimposed onto the biological effects to be measured.

In order to solve this familiar problem, a process of this type has been proposed in the article by K. J. Friston et al. "Movement-Related Effects in fMRI Time-Series". With this imaging technique, the influence caused by movement is eliminated in that, first of all, movement parameters are ascertained by comparing individual measuring runs with a reference measurement and in that the movement is determined by establishing the difference between the measured data and the reference image as a sum encompassing all partial deviations.

The invention has the objective of creating a process that allows a fast, stable and reliable correction of a moving image. Preferably, it should be possible to carry out this process in real time.

SUMMARY OF THE INVENTION

This objective is achieved according to the invention in that the process of this type is carried out in such a way that a gradient of image data in the reference image is determined, in that the gradient of the image data of the reference image in a first coordinate system is ascertained and subsequently transformed into a second coordinate system, and in that subsequently, a movement-corrected vector v' is determined essentially according to the formula $$\frac{\partial S_{ref}(r)}{\partial v} \cdot v' = S_t(r) - S_{ref}(r) + \varepsilon(r),$$

wherein gradients $$\frac{\partial S_{ref}(r)}{\partial v}$$

of the reference image form a matrix, v' stands for a sought vector that indicates a shift between the measured image and the reference image, wherein $S_t(r)$ designates the measured image point, r stands for one of the spatial points for which the cited equation is solved and wherein $S_{ref}(r)$ indicates the corresponding value for the reference image.

Thus, the invention provides for carrying out an imaging process in which a comparison between an ascertained image and a reference image serves to determine a relative position between these images in such a way that image information of the reference image is employed to examine the relative position. Here, the relative position is not limited to lateral shifts, but rather, it also comprises rotational movements as well as combinations of translation and rotation. The quantity $\varepsilon(r)$, which represents an interference, is statistically distributed in simple cases, whereby the expected value for $\varepsilon(r)$—and thus also a mean value—preferably equals zero.

The gradients $$\frac{\partial S_{ref}(r)}{\partial v}$$

are preferably first calculated in a natural coordinate system so that a translation can be depicted in the simplest manner possible. A local transformation is carried out for individual image points (pixels) or for individual volume elements (voxels). This is a locally linearized transformation. This means that a linear combination of the quantities that describe a spatial arrangement is formed in every individual image point or volume element.

As a result, the gradients $$\frac{\partial S_{ref}(r)}{\partial v}$$

are transformed into an expanded coordinate system that depicts rotation, elongation, compression or other locally linear transformations.

Particularly with three dimensions, it is meaningful to have a coordinate system with three translation and rotation parameters in each case. With two dimensions, it is meaningful to have a coordinate system with two translation parameters, one rotation parameter and optionally two compression or elongation parameters. Naturally, also in other dimensions, it is practical to have parameters for compression and elongation.

The reference image used for the selected comparison can be obtained by various means. For instance, the reference image can be obtained during a preceding measurement, either with the same sample or with a test specimen, or else it can be generated in another suitable way, for example, by means of simulation.

The correction can be improved by standardizing the image and the reference image to an essentially identical brightness level, which can be done particularly simply and practically by dividing the brightness values of the image points of an image by the maximum of the brightness values of this image. Such a standardization procedure is advantageously performed for the image as well as for the reference image.

An especially effective correction of the movement can be achieved in that the shift between an image measured at a given point in time and the reference image is determined as a function of a previously calculated shift.

An improved correction can also be attained by iteratively conducting the calculation process for the corrected image points.

In this context, it is particularly advantageous for the iterative repetition to be done according to the following formula:

$$\frac{\partial S_{ref}(r)}{\partial v} \cdot v'_{i+1} = S_t(A(-v_i)r) - S_{ref}(r) + \varepsilon_i(r),$$

wherein $v'_{i+1}$ stands for the correction of the movement parameter in the $(i+1)^{th}$ iteration, A stands for an operator that brings about a locally linearized transformation, for instance, a translation, rotation, compression or elongation, wherein $A(-v_i)r$ depicts a retransformation of the spatial point r with the parameter—$v_i$ and wherein $S_t(A(-v_i)r)$ depicts the movement-corrected image for the $i^{th}$ iteration of the process. Preferably, it applies that $v_{i+1}=A(v'_{i+1})v_i$, wherein $v_{i+1}$ indicates a corrected movement parameter after the $(i+1)^{th}$ iteration. Here, i can have any value between 0 and ∞. However, it has been found that already when i=2, that is to say, with the least possible calculation work, influences caused by movement can be eliminated.

Advantageously, the process is carried out in such a way that, as a function of the quantity $v'_{i+1}$, it is determined which estimated value is employed for $$\frac{\partial S_{ref}(r)}{\partial v}$$

in the next iteration step.

It is particularly advantageous if first, markedly smoothed estimated values are employed for $$\frac{\partial S_{ref}(r)}{\partial v}$$

when the shift ($v'_i$) is greater than a half pixel or voxel and if smaller gradients are used in those cases when the shift is less.

The invention also provides for configuring a computer for the evaluation of data in such a way that the computer works with at least one evaluation means that compares an image with a reference image and that, on the basis of this comparison, ascertains a relative position between the image and the reference image, in that the computer works with at least one means that determines a gradient of image data in the reference image, whereby the gradient of the image data of the reference image in a first coordinate system is ascertained, in that the computer works with at least one means that transforms the image data of the reference image into a second coordinate system, in that the computer works with at least one means that determines a movement-corrected image $S_t(r)$, whereby the movement-corrected image $S_t(r)$ is ascertained according to the formula $$\frac{\partial S_{ref}(r)}{\partial v} \cdot v' = S_t(r) - S_{ref}(r) + \varepsilon(r),$$

wherein $$\frac{\partial S_{ref}(r)}{\partial v}$$

depicts the gradient of the reference image, v' stands for a sought vector that reflects the shift between the measured image and the reference image, wherein $S_t(r)$ designates the measured image point and wherein $S_{ref}(r)$ indicates the corresponding value for the reference image.

The term computer is not to be construed in any limiting fashion. It can refer to any desired unit that is suitable for performing computations. The computer can be a mainframe computer, a work station, a personal computer, a microcomputer or a circuit suitable for doing computations.

Moreover, the invention provides for configuring a nuclear resonance tomograph in such a way that it comprises a computer that works in the manner described here.

Other advantages, special features and practical embodiments of the invention can also be gleaned from the subordinate claims and from the following presentation of examples of preferred embodiments with reference to the drawing.

DETAILED DESCRIPTION OF THE INVENTION

Figure 1:
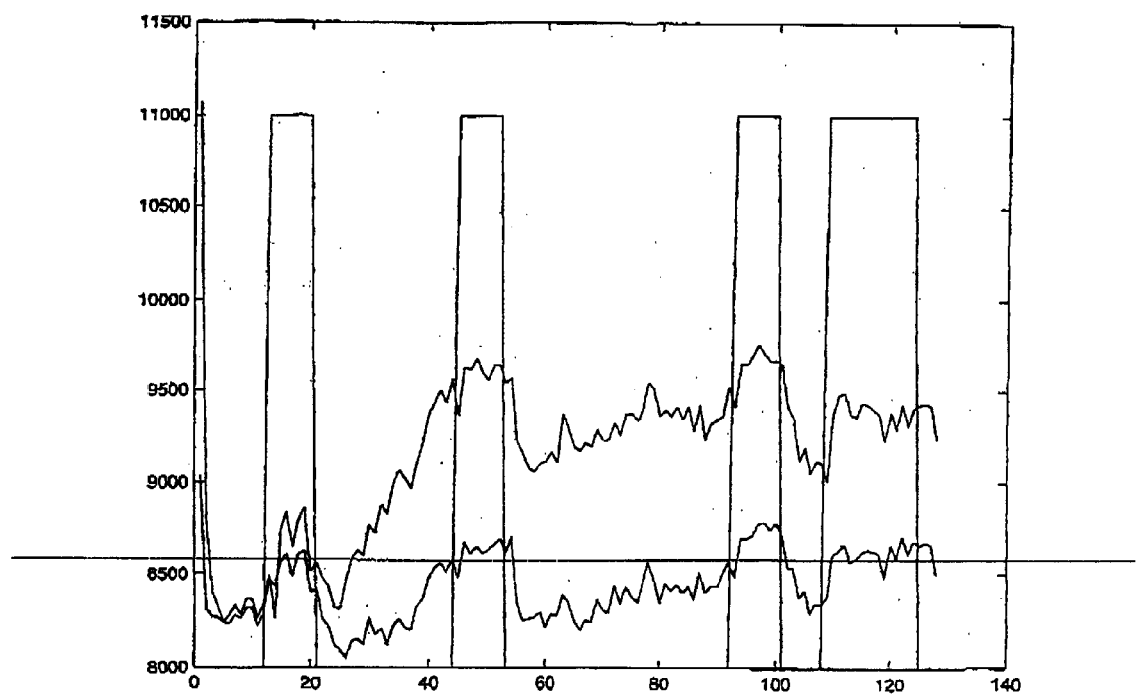
FIG. 1: averaged signals of two voxels in a peripheral region of the human brain.

Averaged signals of two voxels in a peripheral region of the human brain are shown in FIG. 1. Here, the upper curve does not exhibit a movement correction, while the lower curve underwent a movement correction according to the invention. A movement gives rise to fluctuations in the baseline which are equalized by the movement correction.

The drawn columns are motor activation tasks, such as finger movements, made upon request.

Figure 2:
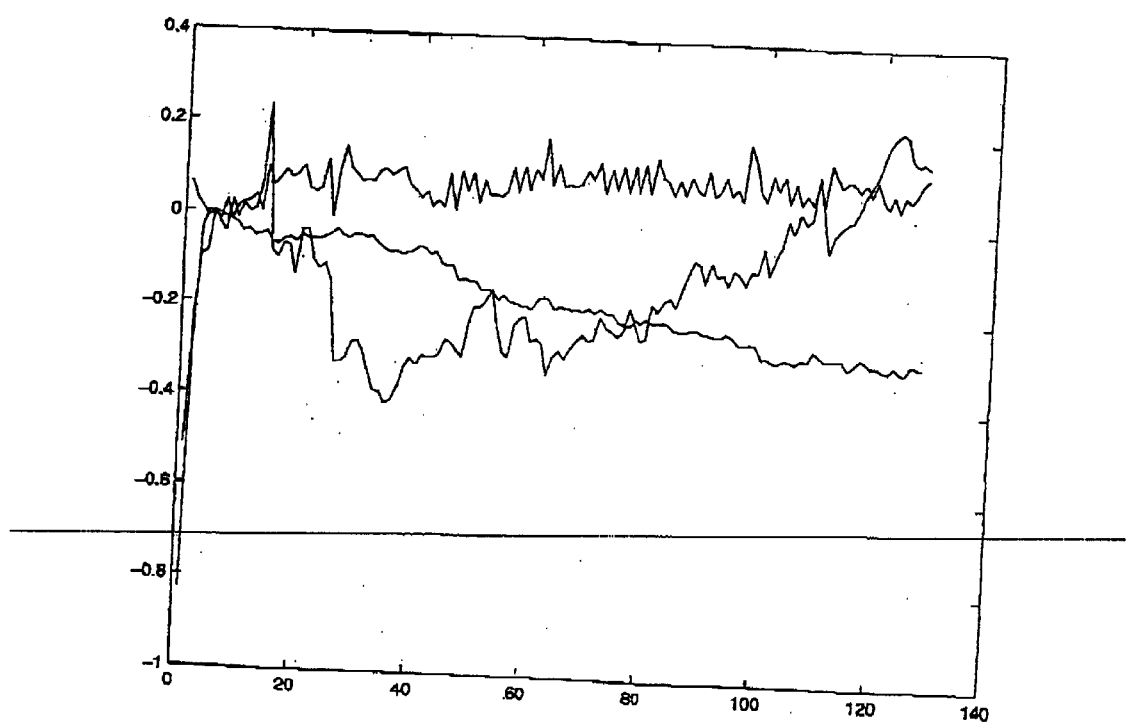
FIG. 2: an ascertained translation as a function of image numbers, whereby the individual image numbers designate an image sequence taken at time intervals of preferably about two seconds.

FIG. 2 depicts an ascertained translation (unit in millimeters) as a function of the image number for the spatial axes x, y and z.

Figure 3:
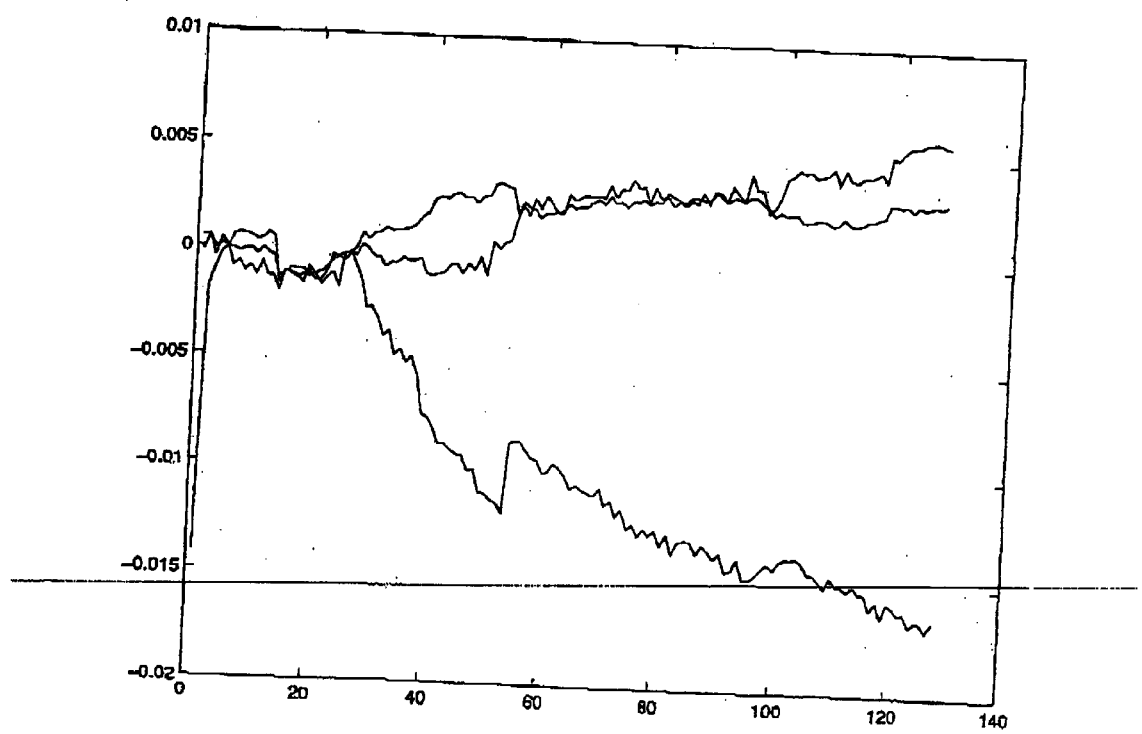
FIG. 3: an ascertained rotation as a function of the image number.

An ascertained rotation (angle measurement of π) around axes lying in the x, y and z directions is shown in FIG. 3 as a function of the image number.

Figure 4:
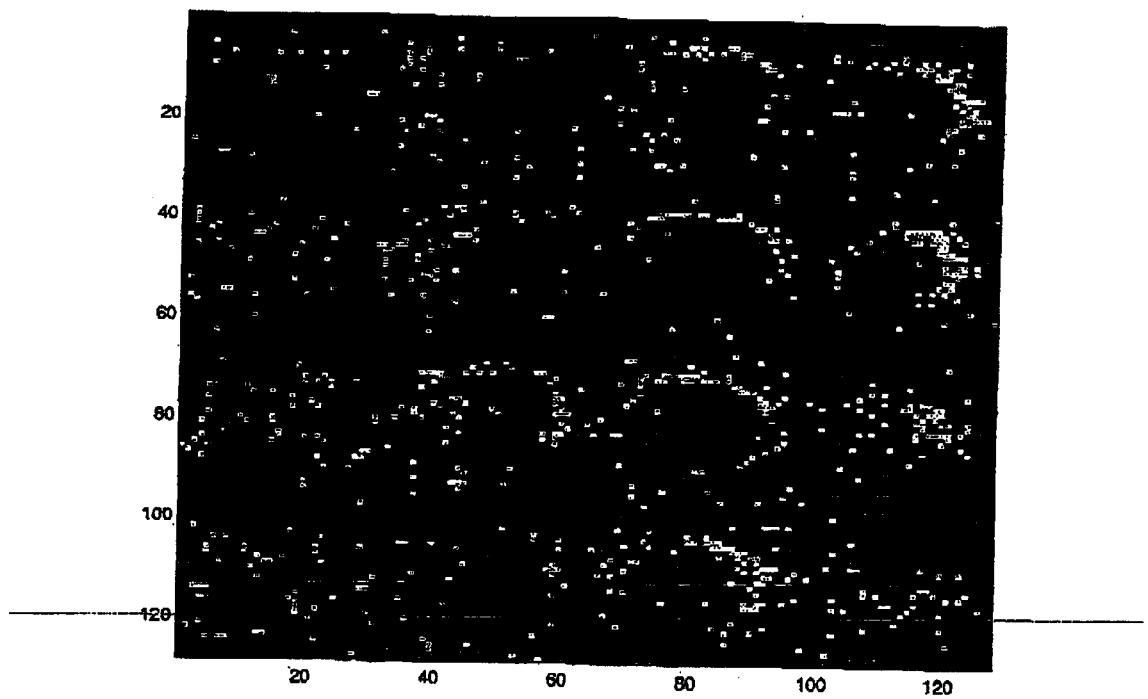
FIG. 4: an apparent detection of brain activation in split images corresponding to 16 layers at 20 points in time, by means of magnetic resonance imaging (MRI)

The uncorrected split images depicted in FIG. 4 show an apparent detection of brain activation in 16 layers. This is not an actual activation of the human brain, but rather, only movement artifacts. Since the occurrence of movement artifacts is particularly pronounced in the peripheral areas of the brain, these areas seem to be particularly highly excited.

Figure 5:
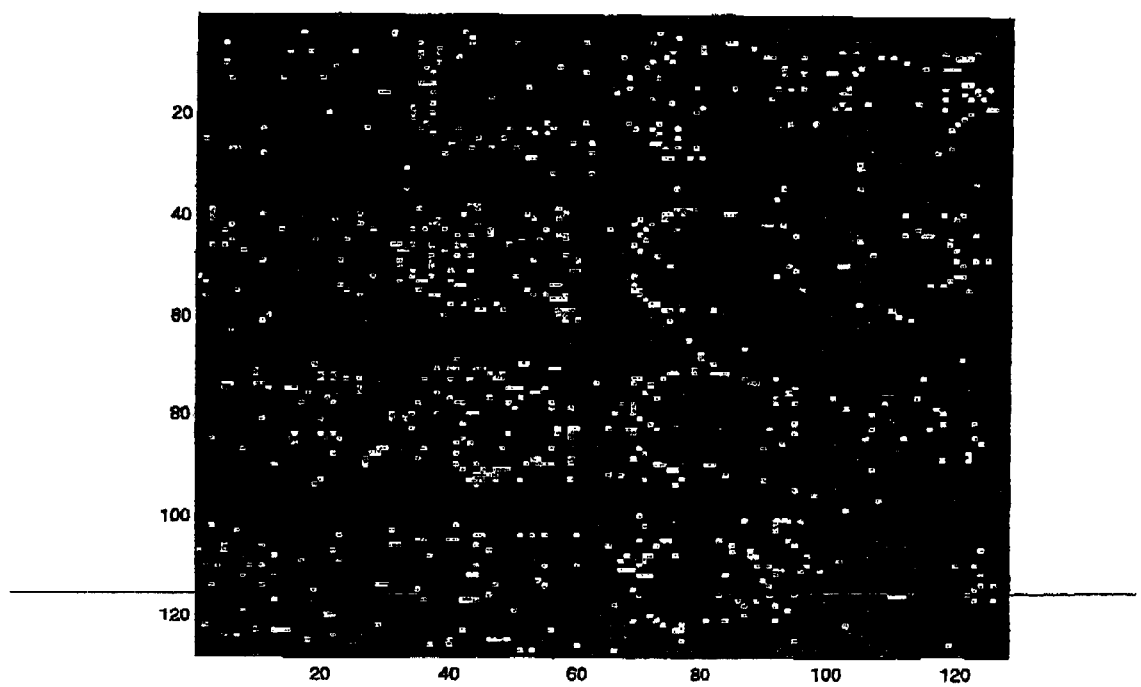
FIG. 5: an actual detection of brain activation in 16 layers at 20 points in time, by means of magnetic resonance imaging (MRI) after a movement correction according to the invention.

The corrected split images depicted in FIG. 5 show a detection of brain activation in 16 layers following a movement correction according to the invention. Here, the actual distribution of the brain activation can be seen as well as considerably less apparent activation in the peripheral areas.

The invention can also be readily employed for other imaging methods such as, for example, the conversion of measured data obtained with ultrasound.

The process according to the invention as well as the computer according to the invention are suitable for all applications in which physical or technical information is depicted in graphic form.

What is claimed is:

1. Imaging process in which measured data is employed to generate at least one image, whereby the image is then compared to a reference image and, on the basis of this comparison, a relative position between the image and the reference image is ascertained and whereby any influence of the relative position is subsequently eliminated, wherein a gradient $$\frac{\partial S_{ref}(r)}{\partial v},$$

of image data of the reference image in a first coordinate system is determined;

a movement-corrected vector v' that indicates a shift between the measured image and the reference image is determined, whereby the movement-corrected vector v' is determined according to the formula $$\frac{\partial S_{ref}(r)}{\partial v} \cdot v' = S_t(r) - S_{ref}(r) + \varepsilon(r),$$

wherein $S_t(r)$ designates the measured image point, $S_{ref}(r)$ indicates the corresponding value for the reference image, and $\varepsilon(r)$ represents interference; and the image data in a first coordinate system is transformed into a second coordinate system.

2. Imaging process according to claim 1, wherein the image and the reference image are standardized to an essentially identical brightness level.

3. Imaging process according to claim 2, wherein the brightness values of image points of an image are divided by the maximum of the brightness values of this image.

4. Imaging process according to claim 1, wherein the shift between an image measured at a given point in time and the reference image is determined as a function of a previously calculated shift.

5. Imaging process according to claim 4, wherein the calculation process for the corrected image points is carried out iteratively.

6. Imaging process according to claim 5, wherein the iterative repetition is done according to the following formula:

$$\frac{\partial S_{ref}(r)}{\partial v} \cdot v'_{i+1} = S_t(A(-v_i)r) - S_{ref}(r) + \varepsilon_i(r),$$

wherein $v'_{i+1}$ stands for the correction of the movement parameter in the $(i+1)^{th}$ iteration, and wherein $S_t(A(-v_i)r)$ depicts the movement-corrected image for the $i^{th}$ iteration of the process.

7. Imaging process according to claim 6, wherein i=2.

8. Imaging process according to claim 5, wherein, as a function of the quantity $v'_{i+1}$, it is determined which estimated value is employed for $$\frac{\partial S_{ref}(r)}{\partial v}$$

in the next iteration step.

9. Imaging process according to claim 8, wherein first, markedly smoothed estimated values are employed for $$\frac{\partial S_{ref}(r)}{\partial v}$$

when the shift $(v'_i)$ is greater than a half pixel or voxel and in that smaller gradients are used in those cases when the shift is less.

10. Computer for the evaluation of data, which comprises means for comparing an image with a reference image and that, on the basis of this comparison, ascertains a relative position between the image and the reference image, means for determining a gradient of image data in the reference image, whereby the gradient of the image data of the reference image in a first coordinate system is ascertained, means for transforming the image data of the reference image into a second coordinate system, means for determining a movement-corrected vector v' that indicates a shift between the measured image and the reference image, whereby the movement-corrected vector v' is determined according to the formula $$\frac{\partial S_{ref}(r)}{\partial v} \cdot v' = S_t(r) - S_{ref}(r) + \varepsilon(r),$$

wherein gradients $$\frac{\partial S_{ref}(r)}{\partial v}$$

of the reference image form a matrix, $S_t(r)$ designates the measured image point, $S_{ref}(r)$ indicates the corresponding value for the reference image, and $\varepsilon(r)$ represents interference.

11. Nuclear resonance tomography system, wherein it comprises at least one computer according to claim 10.

* * * * *